United States Patent
Basso et al.

(10) Patent No.: US 9,077,256 B2
(45) Date of Patent: Jul. 7, 2015

(54) METHOD OF FORMING A LOW POWER DISSIPATION REGULATOR AND STRUCTURE THEREFOR

(75) Inventors: Christophe Basso, Pibrac (FR); Jean-Paul Louvel, Colomiers (FR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 297 days.

(21) Appl. No.: 13/991,488

(22) PCT Filed: Dec. 14, 2010

(86) PCT No.: PCT/US2010/060197
§ 371 (c)(1),
(2), (4) Date: Jun. 4, 2013

(87) PCT Pub. No.: WO2012/082106
PCT Pub. Date: Jun. 21, 2012

(65) Prior Publication Data
US 2013/0272034 A1  Oct. 17, 2013

(51) Int. Cl.
*H02M 3/335* (2006.01)
*G05F 1/575* (2006.01)
*H05K 13/00* (2006.01)

(52) U.S. Cl.
CPC ...... *H02M 3/33546* (2013.01); *Y10T 29/49117* (2015.01); *G05F 1/575* (2013.01); *H05K 13/00* (2013.01)

(58) Field of Classification Search
CPC .......... H02M 3/33546; H02M 7/2176; H02M 2001/007; H02M 2001/0045; H02M 1/36; H02M 1/081
USPC ........................ 323/266, 274, 280, 281, 289; 363/21.04, 44, 65; 29/825
See application file for complete search history.

(56) References Cited

U.S. PATENT DOCUMENTS

| 5,818,708 A | 10/1998 | Wong |
| 7,679,339 B2 * | 3/2010 | Di Franco et al. ............ 323/224 |
| 2007/0024258 A1 | 2/2007 | Di Franco et al. |
| 2007/0114981 A1 | 5/2007 | Vasquez et al. |

OTHER PUBLICATIONS

AN2264, Application Note, "Three-Phase SMPS for low power applications with VIPer12A," STMicroelectronics, 2005.*
AND9172/D, Application Note, "Pre-Regulator for High Voltage Supply," ON Semiconductor, May 2014.*
STMicroelectronics, AN2264 Three-Phase SMPS for low power applications with VIPer12A, Application Note, AN2264/1105 Rev. 1.0, Copyright 2005 STMicroelectronics, pp. 1-42.

* cited by examiner

*Primary Examiner* — Adolf Berhane
*Assistant Examiner* — Jye-June Lee
(74) *Attorney, Agent, or Firm* — Robert F. Hightower

(57) ABSTRACT

In one embodiment, a method of forming a conditioning circuit includes configuring an output biasing network to provide a biasing voltage to an MOS transistor to enable the MOS transistor to operate in a saturated operating mode for input voltages that are less than a threshold voltage.

20 Claims, 5 Drawing Sheets

METHOD OF FORMING A LOW POWER DISSIPATION REGULATOR AND STRUCTURE THEREFOR

BACKGROUND OF THE INVENTION

The present invention relates, in general, to electronics, and more particularly, to semiconductors, structures thereof, and methods of forming semiconductor devices.

In the past, switching power supply controllers were designed as a.c.-d.c. converters to operate over a large range of a.c. input voltages. The a.c. input voltage could vary from about one hundred twenty volts (120 V) rms up to about four hundred volts (400 V) rms. In order to accommodate the wide range of input voltages, input conditioning components were utilized to limit the voltage delivered to the switching power supply controller. Filtering capacitors usually were used as the input conditioning components. The filtering capacitors generally had to have a very high voltage rating in order to operate with the high voltage input voltage values that could be received. The high voltage capacitors were expensive and increased the cost of the power supply system. The capacitors also had a finite power dissipation that added to the power dissipation and reduced the efficiency of the power supply system.

Accordingly, it is desirable to have a method and apparatus that reduces the voltage received by a power supply system, that has a lower cost, that reduces power dissipation, and that improves the efficiency.

Figure 1:
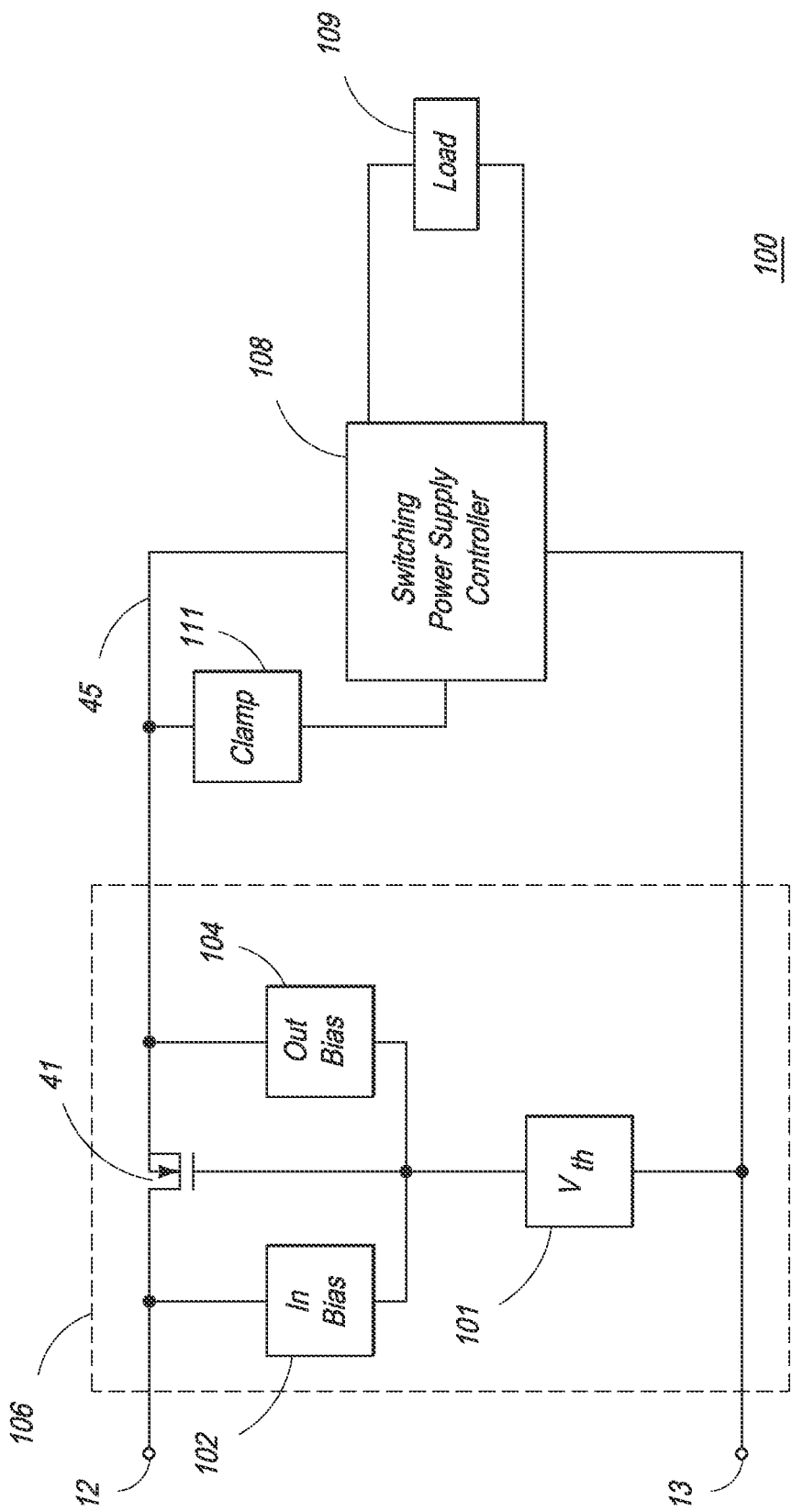
FIG. 1 schematically illustrates an example of an embodiment of a power supply system having a generalized implementation of a conditioning circuit in accordance with an embodiment of the present invention.

For simplicity and clarity of the illustration(s), elements in the figures are not necessarily to scale, and the same reference numbers in different figures denote the same elements, unless stated otherwise. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with the present invention. It will be appreciated by those skilled in the art that the words during, while, and when as used herein relating to circuit operation are not exact terms that mean an action takes place instantly upon an initiating action but that there may be some small but reasonable delay, such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten per cent (10%) (and up to twenty per cent (20%) for semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the Claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. The drawings described are only illustrative and are non-limiting. In the drawings, the size of some of the elements may be exaggerated and not drawn on scale for illustrative purposes. Unless otherwise stated, the dimensions and the relative dimensions do not correspond to actual reductions to practice of the invention. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION OF THE DRAWINGS

FIG. 1 schematically illustrates an example of an embodiment of a power supply system 100 that receives an input voltage between an input terminal 12 and a common return terminal 13 and supplies a regulated dc voltage to a load 109. The input voltage between terminals 12 and 13 typically is a dc voltage such as one generated as a full wave or half wave rectified version of an ac voltage. A conditioning circuit 106 receives the input voltage and provides a conditioned voltage as an output voltage formed by circuit 106 on a node 45. A generalized block diagram of conditioning circuit 106 is identified in a general manner by dashed lines. A switching power supply controller 108 receives the conditioned voltage from node 45 and forms a regulated dc voltage for a load 109. A flyback clamp circuit 111 typically is connected between node 45 and an inductor of circuit 108 to assist in discharging energy stored in the inductor.

Circuit 106 generally includes an MOS transistor 41, an in bias or input biasing circuit 102, an out bias or output biasing circuit 104, and a threshold detection circuit or threshold circuit 101. As will be seen further hereinafter, circuit 106 includes a series pass regulator having transistor 41 with a gate, a drain coupled to receive an input voltage (such as from terminal 12), and a source coupled to form an output voltage; a threshold detection circuit coupled to the gate of the MOS transistor; and an output bias network, such as circuit 104, coupled to the source of the MOS transistor and configured to provide a bias voltage to the gate of the MOS transistor for input voltages that are less than the threshold voltage of circuit 106. A circuit 102 may form a voltage on the gate of transistor 41 for values of the output voltage that are less than the input voltage.

Figure 2:
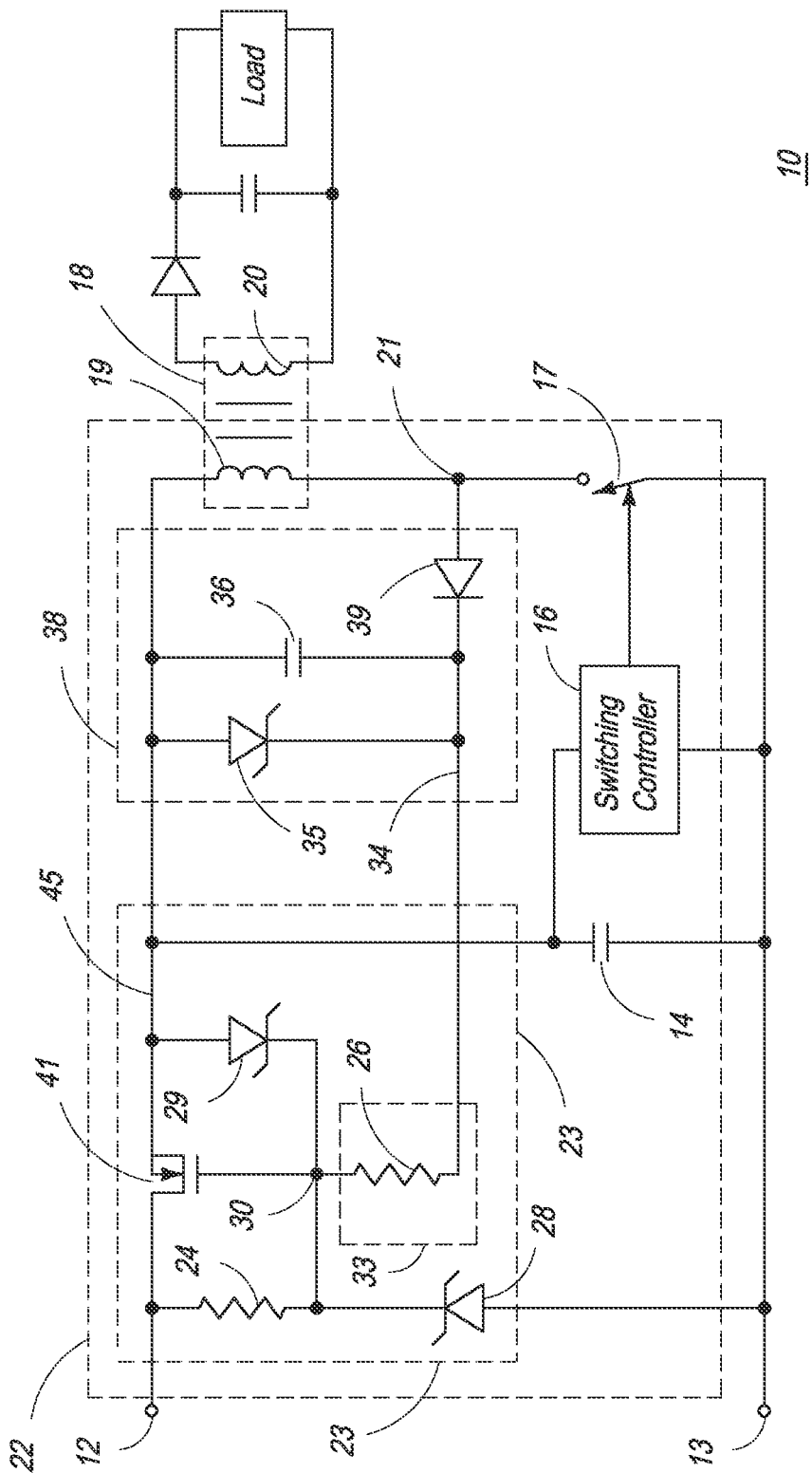
FIG. 2 schematically illustrates an example of an embodiment of a power supply system having a conditioning circuit that is one example embodiment of a circuit that may be used for the conditioning circuit of FIG. 1 in accordance with another embodiment of the present invention.

FIG. 2 schematically illustrates an example of an embodiment of a switching power supply system 10 that is one example embodiment of a circuit that may be used for power supply system 100 that was explained in the description of FIG. 1. System 10 includes a power supply controller 22 that includes a switching power supply controller 16 that is utilized to switchingly enable and disable a power switch 17. Controller 16 may be any type of well-known switching power supply controller such as a pulse width modulated, frequency modulated, or other type of switching power supply controller, and switch 17 may be any type of well-known power switch such as a power MOS transistor or a bipolar transistor. Switch 17 typically is connected between terminal 13 and one end of a primary inductor 19 of a transformer 18 such as at a node 21. Transformer 18 typically has a secondary inductor 20 that is connected to a rectifier and filter to provide the d.c. voltage to load 109. A flyback clamp circuit 38 typically is connected across inductor 19 in order to assist in discharging energy stored in inductor 19. Circuit 38 is one example embodiment of a circuit that may be used for circuit 111 that was explained in the description of FIG. 1.

System 10 also includes a conditioning circuit 23 that is one example embodiment of a circuit that may be used for circuit 106 that was explained in the description of FIG. 1. Circuit 23 is configured to function similarly to circuit 106. Circuit 23 includes a resistor 24 that functions similarly to circuit 102 of FIG. 1, a zener diode 28 that functions similarly to circuit 101 of FIG. 1, and an output biasing circuit 33 that functions similarly to circuit 104 of FIG. 1. As will be seen further hereinafter, the zener voltage of diode 28 minus the magnitude of the Vgs threshold voltage of transistor 41 form a threshold voltage for circuits 22 and 23. Circuit 23 also may include an optional zener diode 29 to protect transistor 41 from excessive voltages that may be applied between the gate and source of transistor 41. Output biasing circuit 33 typically includes a circuit to couple energy from circuit 38 to the gate of transistor 41. In one embodiment, output biasing circuit 33 is a resistor 26. In one embodiment, circuit 38 includes a capacitor 36, a zener diode 35, and a diode 39.

In operation, assume that an input voltage has been applied between terminals 12 and 13 for a period of time and that controller 16 is switching so the capacitor on the secondary side of transformer 18 is charged to a desired value and that capacitors 36 and 37 are also charged. As controller 16 enables switch 17, current flows through transistor 41, inductor 19, and switch 17 thereby storing energy in transformer 18. When controller 16 disables switch 17, the voltage on node 21 increases to a value that is greater than the voltage on node 45 due to the flyback characteristic resulting from the energy stored in inductor 19. The flyback voltage keeps capacitor 36 charged to a value that is greater than the voltage on node 45 such that node 34 has a voltage that is more positive than the voltage on node 45, such as more positive relative to terminal 13. Clamp circuit 38 typically is designed to limit the voltage on node 21 to a value that will not damage switch 17. In one example embodiment, circuit 38 was configured to permit node 34 to charge to a value that is no greater than about one hundred fifty volts (150 V) more than the voltage on node 45.

The operating mode of transistor 41 is dependent upon the instantaneous value of the input voltage between terminals 12 and 13 relative to the threshold voltage of circuit 23. The threshold voltage of circuit 23 is the input voltage value that is approximately equal to the zener voltage of diode 28 minus the magnitude of the Vgs threshold voltage of transistor 41. As long as the input voltage between terminals 12 and 13 is less than the threshold value of circuit 23, diode 28 is not conducting and doesn't affect the gate voltage of transistor 41. Under these conditions, the energy stored in capacitor 36 provides a voltage through resistor 26 which forms a Vgs for transistor 41 that maintains transistor 41 operating in a saturated operating mode. As used herein, saturated operating mode means the operating mode of transistor 41 such that the drain-to-source voltage (Vds) of transistor 41 is approximately equal to Rdson times the current flow through transistor 41, and linear operating mode means the operating mode of transistor 41 such that the Vds of transistor 41 is greater than the Rdson of transistor 41 times the current flow through transistor 41. Those skilled in the art will appreciate that in the linear operating mode, Vds typically is at least two volts (2V) or more greater than the Rdson of transistor 41 times the current flow through transistor 41. In the saturated operating mode, the Vds of transistor 41 is very low and much lower than the Vds when transistor 41 is operating in the linear operating mode. Consequently, in the saturated operating mode the voltage on node 45, relative to terminal 13, is approximately equal to the input voltage. Additionally, because the Vds is very low, current flowing through transistor 41 results in very low power dissipation, much lower than the power dissipation when transistor 41 is operating in a linear operating mode. Therefore, the power dissipation in transistor 41 is very low and the voltage dropped across transistor 41 is also very low. This provides an output voltage that is as great as possible with very low power dissipation which improves the efficiency of a system that uses circuit 23. Additionally, the cost of circuit 23 is very low, which lowers the cost of system 10 over implementations using high-voltage filter capacitors.

If the input voltage between terminals 12 and 13 increases to a value that is no less than the threshold voltage of circuit 23, diode 28 begins to conduct and applies a gate voltage (relative to terminal 13) to transistor 41. Diode 28 maintains the gate of transistor 41 at approximately the zener voltage of diode 28 and the source voltage becomes the zener voltage of diode 28 minus the magnitude of the Vgs of transistor 41. Since the drain voltage from input 12 is greater than the minimum Vds that defines linear operation, transistor 41 operates in the linear operating mode and regulates the value of the voltage on node 45 to substantially the zener voltage of diode 28. In the linear operating mode, the Vds of transistor 41 is greater than in the saturated operating mode and transistor 41 has a higher power dissipation.

The switching of switch 17 by controller 16 keeps capacitor 36 charged so that circuit 33 is available to supply the Vgs for transistor 41 if the input voltage were to decrease to less than the threshold voltage of circuit 23.

During startup when a voltage is first applied between terminals 12 and 13, capacitor 14 is discharged. Since capacitor 14 forms an operational voltage for controller 16, controller 16 has insufficient operating voltage applied and is not switching so the capacitor on the secondary side of transformer 18 is discharged along with capacitor 36. As a voltage is applied between terminals 12 and 13, the drain of transistor 41 has a higher voltage than the source, and resistor 24 applies a voltage to the gate which forms a Vgs to bias transistor 41 to operate in the linear operating mode. Enabling transistor 41 causes transistor 41 to conduct current and apply a voltage to capacitor 14 which eventually charges capacitor 14. When capacitor 14 charges sufficiently, controller 16 begins operating and switchingly operates switch 17. During this start-up operation, the switching of switch 17 charges capacitor 36. Thus, the source voltage of transistor 41 increases until becoming no greater than the threshold voltage of circuit 23. Once the source voltage reaches the threshold voltage of circuit 22, the operating mode of transistor 41 is determined by the value of the input voltage relative to the threshold voltage of circuit 22, thus circuit 23, as explained hereinbefore.

In order to facilitate the hereinbefore described functionality for circuit 22, resistor 24 as a first terminal connected to input 12 and a second terminal connected to node 30. Transistor 41 has the drain connected to terminal 12, the gate connected to node 30, and the source connected to output 45. Diode 29 has an anode connected to output 45 and a cathode connected to node 30. Resistor 26 has a first terminal connected to node 30 and a second terminal connected to node 34. Diode 28 has a cathode connected to node 30 and an anode connected to terminal 13. Diode 35 has an anode connected to output 45 and a cathode connected to node 34. Capacitor 36 has a first terminal connected to output 45 and a second terminal connected to node 34 which is also connected to a cathode of diode 39. An anode of diode 39 is connected to node 21 and to one terminal of switch 17. A second terminal of switch 17 is connected to terminal 13 and a control input of switch 17 is connected to a switching drive output of controller 16. Inductor 19 of transformer 18 has a first terminal connected to node 21 and a second terminal connected to output 45.

Figure 3:
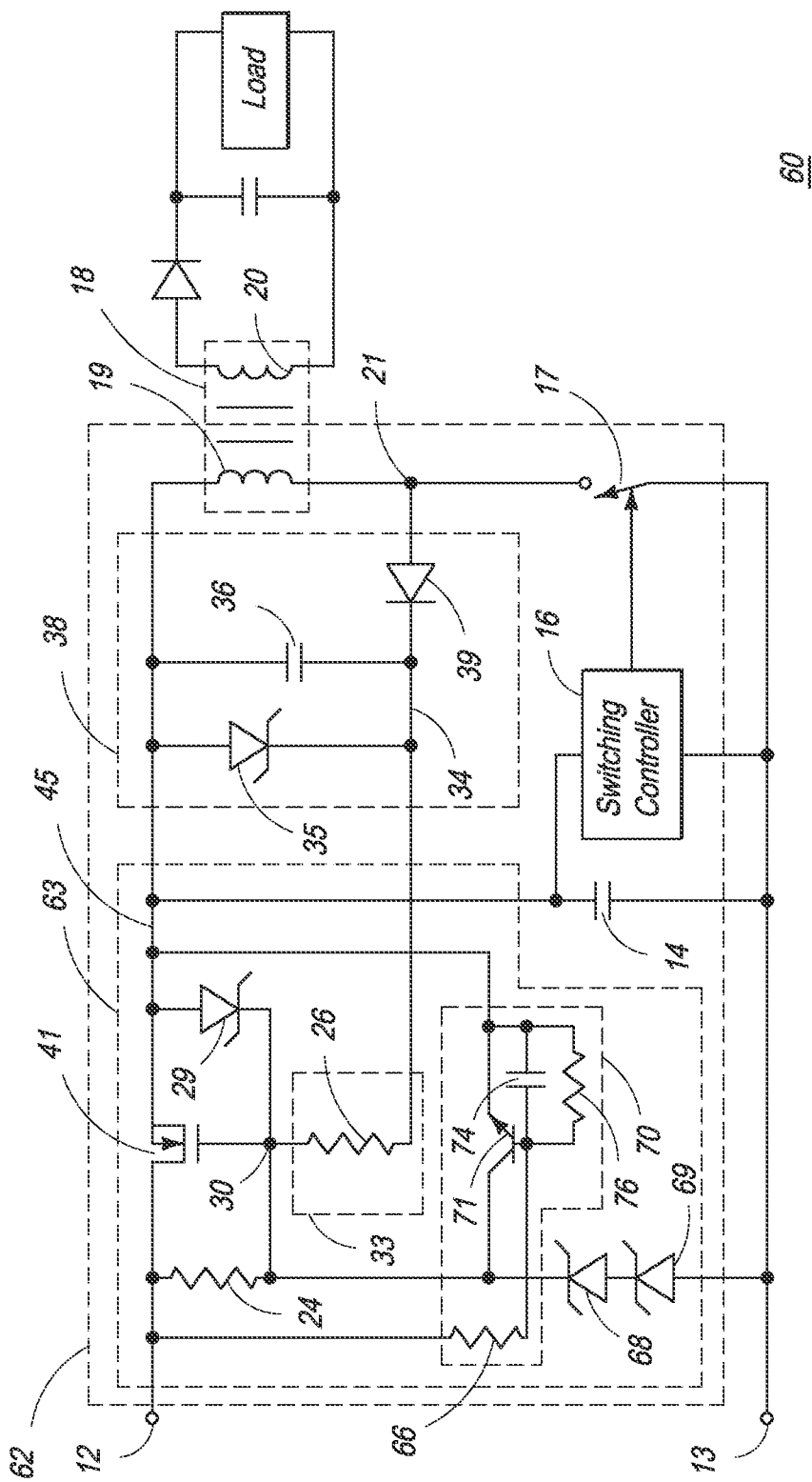
FIG. 3 schematically illustrates an example of an embodiment of a power supply system having another conditioning circuit that is one example embodiment of a circuit that may be used for the conditioning circuit of FIG. 1 in accordance with another embodiment of the present invention.

FIG. 3 schematically illustrates an example of an embodiment of a switching power supply system 60 that is an alternate embodiment system 10 of FIG. 2. System 60 includes a power supply controller 62 that is an alternate embodiment of controller 22 that was explained in the description of FIG. 2. Controller 62 also includes a conditioning circuit 63 that is an alternate embodiment of circuit 23 that was explained in the description of FIG. 2 and that may be used for circuit 106 that was explained in the description of FIG. 1. Circuit 63 includes a threshold detection circuit that includes a plurality of zener diodes, such as diodes 68 and 69, that is suitable for use as circuit 101 of FIG. 1. Circuit 63 also includes an optional power reduction circuit 70 that assists in reducing the power dissipation of circuit 62. Circuit 70 also may be used as a portion of circuit 22 of FIG. 2. Circuit 70 includes a transistor 71, a sensing circuit, and a response time capacitor 74. When the input voltage is less than the threshold voltage of circuit 62, transistor 41 is operating in the saturated operating mode and the Vds of transistor 41 is low. A resistor divider formed by resistors 66 and 76 functions as a sensing circuit that senses the Vds of transistor 41 and form a base-to-emitter voltage (Vbe) for transistor 71 that is representative of the Vds of transistor 41. The value of resistors 66 and 76 are chosen so that for this operating mode, the Vbe of transistor 71 is too low to enable transistor 71, thus, transistor 71 is turned Off. In other embodiments, the sensing circuit may use other well-known sense elements instead of or in addition to the resistor divider. If the input voltage increases to a value that is no less than the threshold voltage of circuit 62, transistor 41 operates in the linear operating mode and the Vds of transistor 41 increase. The increased Vds increases the Vbe of transistor 71 and if the Vds becomes large enough it can enable transistor 71. Enabling transistor 71 shorts together the gate and source of transistor 41 which turns transistor 41 Off. Disabling transistor 41 further reduces the power dissipation of circuit 62 and improves the efficiency of system 60. The value of resistors 66 and 76 usually are chosen such that transistor 71 is not enabled until the Vds of transistor 41 increase to a value that is much greater than the Vds for operation in the linear operating mode. For example, transistor 71 may not be enabled until the Vds of transistor 41 is ten volts (10V) or more greater than the Vds for operation in the linear operating mode. As can be seen, the sense circuit is configured to sense the Vds of transistor 41 and inhibit the MOS transistor for Vds values that are greater than a first value. Therefore, circuit 62 can have three operating modes, the saturated operating mode of transistor 41 when the input voltage is less than the threshold voltage, the linear operating mode when the input voltage is greater than the threshold voltage by a first amount, and a blocked operating mode when the input voltage is greater than the threshold voltage by a second amount that is greater than the first amount wherein transistor 71 is enabled. When the input voltage decreases to less than the value for operating in the blocked operating mode, the Vbe of transistor 71 decrease through resistors 66 and 76, and transistor 71 again becomes disabled. With transistor 71 disabled, transistor 41 can operate in either the saturated or linear operating modes as described hereinbefore. Those skilled in the art will appreciate that in some cases, transistor 41 may only be disabled for only a portion of a cycle since the input voltage may be large enough to form a high Vds to enable transistor 71 for a portion of a cycle.

In order to provide this functionality for circuit 62, a first terminal of resistor 66 is connected to the drain of transistor 41 and a second terminal of resistor 66 is connected to a base of transistor 71. A first terminal of resistor 76 is connected to the base of transistor 71 and a second terminal of resistor 76 is commonly connected to the drain of transistor 41, an emitter of transistor 71, and a first terminal of capacitor 74. A second terminal of capacitor 74 is connected to the base of transistor 71. A collector of transistor 71 is connected to the gate of transistor 41 and to an output terminal of the threshold detection circuit. A cathode of diode 68 is connected the output of the threshold detection circuit, and an anode of diode 68 is connected to a cathode of diode 69 which has an anode connected to terminal 13.

Figure 4:
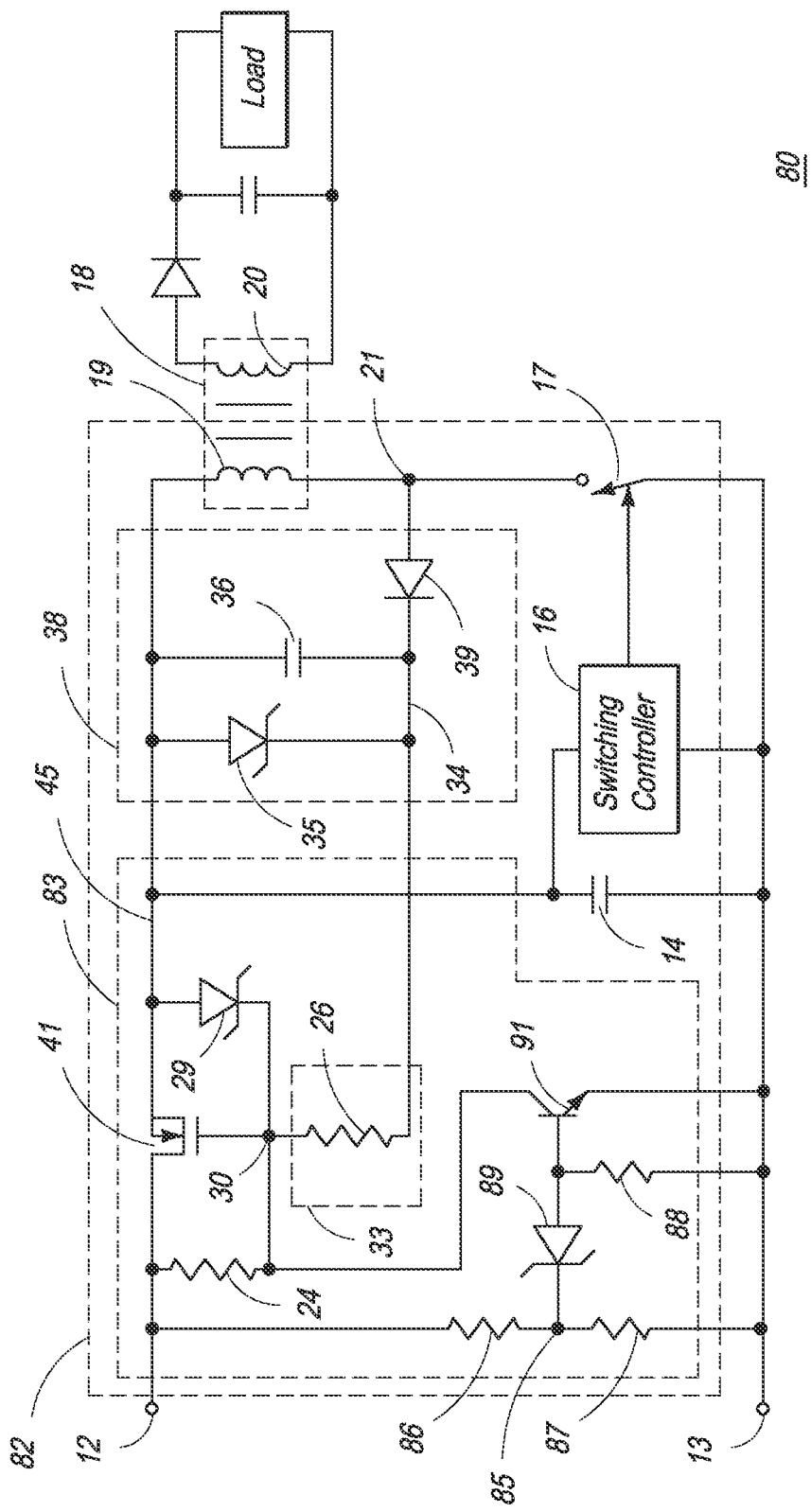
FIG. 4 schematically illustrates an example of an embodiment of a power supply system having another conditioning circuit that is one example embodiment of a circuit that may be used for the conditioning circuit of FIG. 1 in accordance with another embodiment of the present invention.

FIG. 4 schematically illustrates an example of an embodiment of a switching power supply system 80 that is an alternate embodiment system 10 of FIG. 2. System 80 includes a power supply controller 82 that is an alternate embodiment of controller 22 that was explained in the description of FIG. 2. Controller 82 includes a conditioning circuit 83 that is an alternate embodiment of circuit 23 that was explained in the description of FIG. 2 and that may be used for circuit 106 that was explained in the description of FIG. 1. Circuit 83 includes a threshold detection circuit that is suitable for use as circuit 101 of FIG. 1. The threshold detection circuit includes a transistor 91, resistors 86-88, and a zener diode 89. When the input voltage increases to a value that causes diode 89 to conduct, transistor 91 may become enabled and hold the gate of transistor 41 at the value form by the resistor divider at node 85. Those skilled in the art will appreciate that the alternate threshold detection circuit may be used for the threshold detection circuit of controllers 22 of FIG. 1 or controller 62 of FIG. 3.

In order to facilitate this functionality for circuit 82, a collector of transistor 91 is connected to node 30, an emitter is connected to terminal 13, and a base is commonly connected to an anode of diode 89 and a first terminal of resistor 88. A cathode of diode 89 is connected to a first terminal of resistor 87 and a first terminal of resistor 86. A second terminal of resistor 87 is connected to terminal 13 and to a second terminal of resistor 88. A second terminal of resistor 86 is connected to terminal 12.

Figure 5:
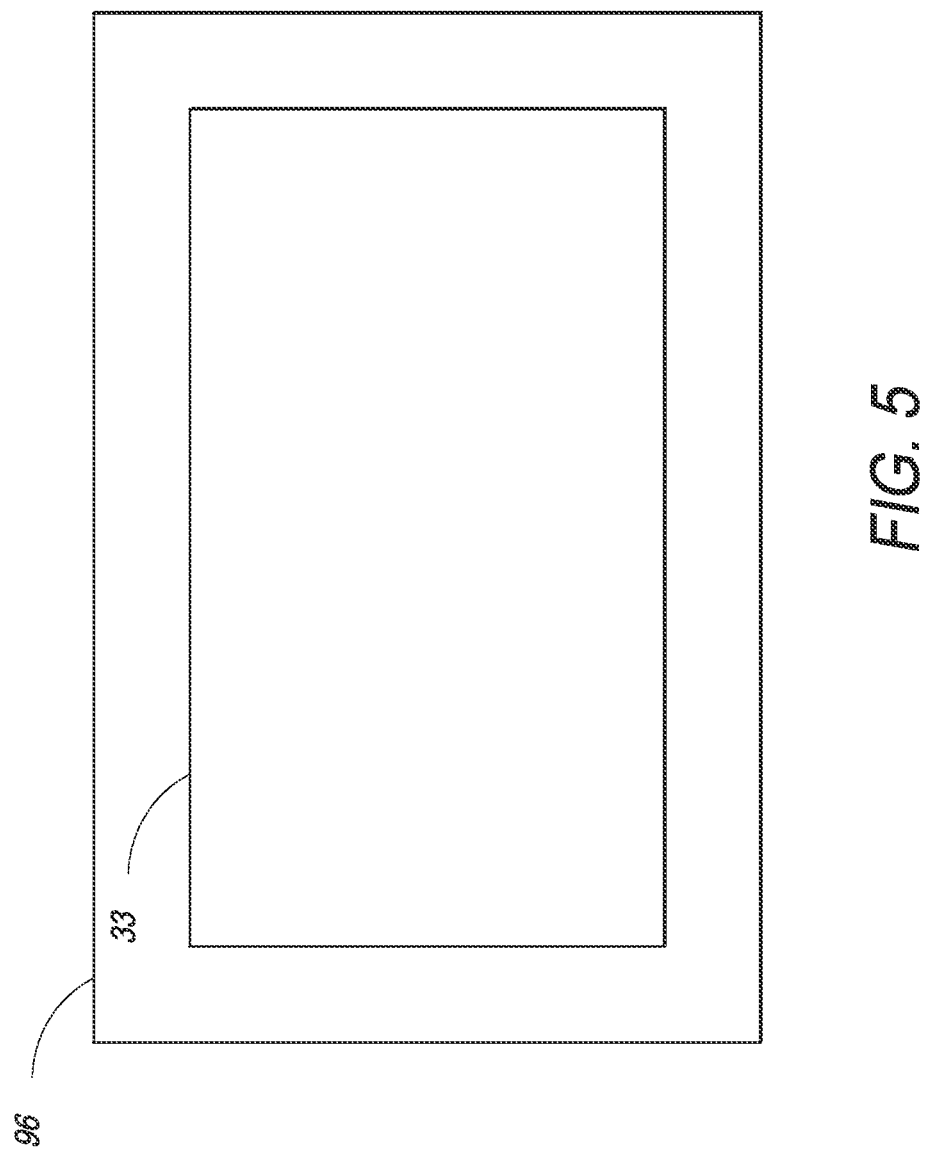
FIG. 5 illustrates an enlarged plan view of a semiconductor device that includes the conditioning circuit of FIG. 2 or FIG. 3 in accordance with another embodiment of the present invention.

FIG. 5 illustrates an enlarged plan view of a portion of an embodiment of a semiconductor device or integrated circuit 95 that is formed on a semiconductor die 96. Circuit 33 may be formed on die 96. Die 96 may also include other circuits that are not shown in FIG. 3 for simplicity of the drawing, such as circuit 23 and/or circuit 16. Circuit 33 and device or integrated circuit 95 are formed on die 96 by semiconductor manufacturing techniques that are well known to those skilled in the art.

From all the foregoing one skilled in the art can determinate that according to one embodiment, a method of forming a series pass regulator comprises: configuring an input, such as input 12, of the series pass regulator to receive an input voltage; configuring the series pass regulator to form an output voltage on an output, such node 45, of the series pass regulator; coupling an MOS transistor, such as transistor 41, of the series pass regulator in series between the input and the output wherein the MOS transistor receives the input voltage from the input on a drain of the MOS transistor and conducts a current to the output from a source of the MOS transistor; and configuring an output biasing network to form a gate-to-source voltage that is greater than a gate-to-source saturation voltage of the MOS transistor for conditions of the input voltage that are less than a threshold voltage of the series pass regulator.

The method may further include configuring an input biasing network to form a gate-to-source voltage that is greater than the gate-to-source threshold voltage of the MOS transistor. In one example, the input biasing network may be a resistor.

Furthermore, in one embodiment the MOS transistor may be configured for coupling between the input and an inductor of a PWM regulator.

Another embodiment of the method may include coupling a regulator element between a gate of the MOS transistor and a voltage return of the series pass regulator.

The method may further include configuring the output to receive a voltage from a PWM regulator or alternately may also include configuring the MOS transistor for coupling between the input and an inductor of the PWM regulator.

A further embodiment of the method may include coupling a zener diode between the output of the series pass regulator and the output biasing network, coupling a capacitor in parallel with the zener diode, and coupling energy from the capacitor to a gate of the MOS transistor.

In another embodiment, a conditioning circuit for a power supply may include an MOS transistor, such as transistor 41, having a gate, a drain coupled to receive an input voltage (such as from input 12), and a source coupled to form an output voltage; a threshold detection circuit or threshold circuit, such as circuit 101, coupled to the gate of the MOS transistor; and an output bias network, such as circuit 104, coupled to the gate of the MOS transistor and configured to provide a bias voltage to the gate of the MOS transistor for input voltages that are less than the threshold voltage of circuit 106.

Additionally, the conditioning circuit may include an input biasing circuit, such as circuit 102, coupled to receive the input voltage and form a gate voltage for the MOS transistor alternately, the input biasing network may also form a gate-to-source voltage that is greater than a gate-to-source threshold voltage of the MOS transistor.

The sense circuit may also be configured to sense a Vds of the MOS transistor and inhibit the MOS transistor for Vds values that are greater than a first value.

In another embodiment, the output biasing network may be configured to receive a voltage from a switching power supply and forms a gate-to-source voltage for the MOS transistor.

The output biasing network may be also be configured for coupling to a capacitor that is coupled to receive the voltage from the switching power supply and apply a voltage to the output bias network.

In another embodiment, the output biasing network may include a resistor coupled to the gate of the MOS transistor.

The threshold detection circuit may include a regulator element, such as circuit 101.

In accordance with another embodiment, a method of forming a conditioning circuit comprises: coupling an MOS transistor in series between an input and an output of the conditioning circuit wherein the MOS transistor receives an input voltage from the input on a drain of the MOS transistor and forms an output voltage on a source of the MOS transistor; configuring a threshold circuit, such as circuit 101, with a threshold voltage and configuring the threshold circuit to cause the MOS transistor to operate in a linear operating mode for input voltages that are greater than the threshold voltage; and configuring an output biasing network, such as circuit 104, to provide a biasing voltage to the MOS transistor to enable the MOS transistor to operate in a saturated operating mode for input voltages that are less than the threshold voltage.

The method may also include configuring the output of the conditioning circuit to receive a voltage from a PWM regulator.

In another embodiment, the method may include configuring the output biasing network to provide the biasing voltage to the MOS transistor under the condition of the output voltage being greater than the threshold voltage.

Another embodiment of the method may also include including coupling an input biasing network to provide a voltage to a gate of the MOS transistor that is less than the threshold voltage for values of the input voltage that are between zero and the threshold voltage under the condition of the output voltage being less than the input voltage.

In view of all of the above, it is evident that a novel device and method is disclosed. Included, among other features, is forming a conditioning circuit to have a low voltage drop and low power dissipation for values of the input voltage that are less than a threshold voltage of the conditioning circuit. The low power dissipation facilitates forming the power supply with less elements and with less costly elements thereby reducing the costs, and also facilitates the power supply having a lower power dissipation thereby improving the efficiency of a system that uses the conditioning circuit.

While the subject matter of the descriptions are described with specific preferred embodiments and example embodiments, the foregoing drawings and descriptions thereof depict only typical and exemplary embodiments of the subject matter and are not therefore to be considered to be limiting of its scope, it is evident that many alternatives and variations will be apparent to those skilled in the art. As will be appreciated by those skilled in the art, the exemplary form of system 10 and controller 16 are illustrated in a flyback configuration, but other well-known configurations may be used including a buck configuration. However, those skilled in the art will appreciated that the method of using an output biasing circuit to form a Vgs for a pass transistor, such as transistor 41, to operate in the saturated operating mode for input voltage that are less than a voltage that is sufficient to enable a regulator circuit coupled to the gate of the transistor can apply to other types of circuits that utilize a pass transistor, including using a bipolar transistor instead of a MOS transistor. Those skilled in the art will also appreciate that in a buck configuration, an auxiliary winding may be used to form the voltage formed by circuit 38. Although a single diode 28 is illustrated as coupled to the gate of transistor 41, those skilled in the art will appreciated that a plurality of zener diodes may connected in a series configuration with one of the plurality of zener diodes connected to the gate of transistor 41. Additionally, another type of a regulator element may be used instead of diode 28. Circuit 23 may be configured with various other embodiments in addition to the embodiment illustrated in FIG. 2 as long as the circuit is configured to provide a bias voltage to the gate of transistor 41 and operate transistor 41 is a saturated operating mode for input voltages that are less than the threshold voltage of circuit 106. Additionally, the word "connected" is used throughout for clarity of the description, however, it is intended to be interpreted as including either a direct connection or an indirect connection.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A method of forming a series pass regulator comprising:
configuring an input of the series pass regulator to receive an input voltage; configuring the series pass regulator to form an output voltage on an output of the series pass regulator;
coupling a MOS transistor of the series pass regulator in series between the input and the output wherein the MOS transistor receives the input voltage from the input on a drain of the MOS transistor and conducts a current to the output from a source of the MOS transistor; and
configuring an output biasing network to form a gate-to-source voltage that is greater than a gate-to-source saturation voltage of the MOS transistor for conditions of the input voltage that are less than a threshold voltage of the series pass regulator.

2. The method of claim 1 further including configuring an input biasing network to form the gate-to-source voltage that is greater than a gate-to-source threshold voltage of the MOS transistor.

3. The method of claim 2 wherein configuring the input biasing network includes coupling a resistor between a gate of the MOS transistor and the input.

4. The method of claim 1 further including coupling a regulator element between a gate of the MOS transistor and a voltage return of the series pass regulator.

5. The method of claim 1 further including configuring the output to receive a voltage from a PWM regulator.

6. The method of claim 5 wherein coupling the MOS transistor of the series pass regulator in series between the input and the output includes configuring the MOS transistor for coupling between the input and an inductor of the PWM regulator.

7. The method of claim 1 wherein configuring the output biasing network includes coupling a zener diode between the output of the series pass regulator and the output biasing network, coupling a capacitor in parallel with the zener diode, and coupling energy from the capacitor to a gate of the MOS transistor.

8. A conditioning circuit for a power supply controller comprising:
a MOS transistor having a gate, a drain coupled to receive an input voltage, and a source coupled to form an output voltage;
a threshold detection circuit coupled to the gate of the MOS transistor, the threshold detection circuit having a threshold voltage; and
an output bias network coupled to the gate of the MOS transistor, the output bias network configured to receive the output voltage and provide a bias voltage to the gate of the MOS transistor for input voltages that are less than the threshold voltage.

9. The conditioning circuit of claim 8 further including an input biasing network configured to supply a bias voltage from the input voltage to the gate of the MOS transistor.

10. The conditioning circuit of claim 9 wherein the input biasing network forms a gate-to-source voltage that is greater than a gate-to-source threshold voltage of the MOS transistor.

11. The conditioning circuit of claim 9 further including a sense circuit configured to sense a Vds of the MOS transistor and inhibit the MOS transistor for Vds values that are greater than a first value.

12. The conditioning circuit of claim 8 wherein the threshold detection circuit includes a regulator circuit coupled to the gate of the MOS transistor.

13. The conditioning circuit of claim 8 wherein the output bias network receives a voltage from a switching power supply and forms a gate-to-source voltage for the MOS transistor.

14. The conditioning circuit of claim 13 wherein the output bias network is configured for coupling to a capacitor that is coupled to receive the voltage from the switching power supply and apply a voltage to the output bias network.

15. The conditioning circuit of claim 14 further including a zener diode having an anode coupled to receive the voltage from the switching power supply and a cathode coupled to the output bias network, and wherein the zener diode is coupled in parallel with the capacitor.

16. The conditioning circuit of claim 8 wherein the output bias network includes a resistor coupled to the gate of the MOS transistor.

17. A method of forming a conditioning circuit comprising:
coupling an MOS transistor in series between an input and an output of the conditioning circuit wherein the MOS transistor receives an input voltage from the input on a drain of the MOS transistor and forms an output voltage on a source of the MOS transistor;
configuring a threshold circuit with a threshold voltage and configuring the threshold circuit to cause the MOS transistor to operate in a linear operating mode for input voltages that are greater than the threshold voltage; and configuring an output biasing network to provide a biasing voltage to the MOS transistor to enable the MOS transistor to operate in a saturated operating mode for input voltages that are less than the threshold voltage.

18. The method of claim 17 wherein configuring the output biasing network to provide the biasing voltage to the MOS transistor includes provide the biasing voltage to the MOS transistor under the condition of the output voltage being greater than the threshold voltage.

19. The method of claim 17 further including configuring the output of the conditioning circuit to receive a flyback voltage from an inductor of a PWM regulator.

20. The method of claim 17 further including coupling an input biasing network to provide a voltage to a gate of the MOS transistor that is less than the threshold voltage for values of the input voltage that are between zero and the threshold voltage under the condition of the output voltage being less than the input voltage.

* * * * *